United States Patent
Ji (10) Patent No.: US 8,576,037 B1
(45) Date of Patent: Nov. 5, 2013

(54) DUAL OUTPUT AUTOTRANSFORMER

(75) Inventor: Daxiong Ji, Brooklyn, NY (US)

(73) Assignee: Scientific Components Corporation, Brooklyn, NY (US)

( * ) Notice: Subject to any disclaimer, the term of this patent is extended or adjusted under 35 U.S.C. 154(b) by 0 days.

(21) Appl. No.: 13/435,936

(22) Filed: Mar. 30, 2012

Related U.S. Application Data (60) Provisional application No. 61/482,602, filed on May 4, 2011.

(51) Int. Cl.
| | |
|---|---|
| H01F 21/02 | (2006.01) |
| H01F 27/28 | (2006.01) |
| H01F 5/00 | (2006.01) |
| H01F 27/24 | (2006.01) |

(52) U.S. Cl.
USPC ........... 336/148; 336/170; 336/200; 336/214; 336/215; 336/212; 336/213

(58) Field of Classification Search
USPC .......... 336/148, 170, 200, 214, 215, 212, 213
See application file for complete search history.

(56) References Cited

U.S. PATENT DOCUMENTS

| | | | |
|---|---|---|---|
| 4,516,092 A | | 5/1985 | Rosenberg |
| 5,097,234 A | | 3/1992 | Andresen |
| 5,200,718 A | * | 4/1993 | Kato ................................. 333/25 |
| 5,414,402 A | | 5/1995 | Mandai et al. |
| 5,705,962 A | | 1/1998 | Fleeger et al. |
| 5,726,612 A | | 3/1998 | Mandai et al. |
| 6,252,761 B1 | | 6/2001 | Branchevsky |
| 6,470,545 B1 | | 10/2002 | Branchevsky |
| 6,542,047 B2 | | 4/2003 | Chen et al. |
| 6,628,189 B2 | * | 9/2003 | Yazaki et al. .................. 336/200 |
| 6,806,790 B2 | * | 10/2004 | Ji ................................... 333/119 |
| 6,937,454 B2 | | 8/2005 | Mikolajczak et al. |
| 6,963,255 B2 | | 11/2005 | Zheng et al. |
| 7,012,485 B2 | | 3/2006 | Ji |
| 2002/0113682 A1 | * | 8/2002 | Gevorgian et al. ............ 336/200 |
| 2009/0195324 A1 | * | 8/2009 | Li et al. ............................ 333/25 |
| 2009/0219127 A1 | * | 9/2009 | Tomonari et al. ............. 336/192 |
| 2010/0134229 A1 | * | 6/2010 | Ueki .............................. 336/119 |
| 2011/0279209 A1 | * | 11/2011 | Schoessow ................... 336/192 |
| 2012/0139658 A1 | * | 6/2012 | Mu ................................. 333/25 |

OTHER PUBLICATIONS

MABA-007681-CT2010 Data Sheet, M/A-Com Technology Solutions, Inc (Undated).
MABA-01247-2R1250 Data Sheet, M/A-Com Technology Solutions, Inc. (Undated).
RF Transformers Wideband, 10kHz to 1400 MHz, Scientific Components Corp., Brooklyn, NY 11235 (Undated).
RF Impedance Transformer Surface Mount Model: TMI-0, Synergy Microwave Corporation, Paterson, NJ 07504 (Copyright 2006).

* cited by examiner

*Primary Examiner* — Lincoln Donovan
*Assistant Examiner* — Kazi Hossain
(74) *Attorney, Agent, or Firm* — Siegmar Silber, Esq.

(57) ABSTRACT

A dual output autotransformer is realized by employing a novel topology in which three transformers are wound on a single, high permeability, ferrite, binocular core. The three transformers are (1) an autotransformer; (2) a coupled winding to the autotransformer; and, (3) a transmission line transformer. Within the topology employed, the outputs of the coupled line transformer and the transmission line transformer provide the balanced output (secondary) and the input to the autotransformer forms the unbalanced primary. Such an approach results in a wideband response of from 30 MHz to 3000 MHz or greater with the requisite amplitude and phase balance.

20 Claims, 9 Drawing Sheets

DUAL OUTPUT AUTOTRANSFORMER

CROSS-REFERENCE TO RELATED APPLICATIONS

This application claims the benefit of U.S. Provisional Application No. 61/482,602, filed May 4, 2011, entitled DUAL OUTPUT AUTOTRANSFORMER. The disclosure of that provisional application is incorporated herein by reference.

BACKGROUND OF THE INVENTION

1. Field of the Invention

The present invention relates to a wideband transformer/balun and more particularly, to a wideband 1:2 transformer/balun having a 30-3000 MHz bandwidth with good impedance matching. Such transformers find application in wideband, push-pull amplifiers for modern communication systems.

2. Description of the Prior Art

This invention generally relates to transformer/baluns surface mounted on printed circuit boards (PCB) and more particularly to a topology in which multiple transformers including autotransformers and transmission line transformers are wound on a single, binocular core.

An autotransformer has only a single winding, which is tapped at some point along the winding. AC or pulsed voltage is applied across a portion of the winding, and a higher (or lower) voltage is produced across another portion of the same winding. The higher voltage will be connected to the ends of the winding, and the lower voltage from one end to a tap. For example, a transformer with a tap at the center of the winding can be used with 230 V across the entire winding, and 115 volts between one end and the tap. It can be connected to a 230 V supply to drive 115 V equipment, or reversed to drive 230 V equipment from 115 V. Since the current in the windings is lower, the transformer is smaller, lighter cheaper and more efficient. For voltage ratios not exceeding about 3:1, an autotransformer is cheaper, lighter, smaller and more efficient than an isolating (two-winding) transformer of the same rating.

For radio frequency use, transformers are sometimes made from configurations of transmission line, sometimes bifilar or coaxial cable, wound around ferrite or other types of core. This style of transformer gives an extremely wide bandwidth but only a limited number of ratios (such as 1:9, 1:4 or 1:2) can be achieved with this technique.

Typical of the commercially available, PCB surface-mounted transformers are those available from Scientific Components Corporation (the assignee hereof), Model No TC2-1TG2+, Model No. TX-2-5-1 and Model No. ED-14406; from Synergy Microwave, Part N TM-2-1; and, from M/A Com, Part No MABA-007681-CT2010 and Part No MABA-010247-2R1250.

The bandwidths of these items are respectively 3 to 300 MHz, 30 to 1100 MHz, 10 to 2500 MHz, 1 to 600 MHz, 5 to 1200 MHz, and 1 to 1600 MHz which ranges do not approach those of the present invention.

Further, while the topology of the M/A Com devices is unknown, none of the other items share the topology of the present invention.

U.S. Pat. No. 6,963,255 entitled POWER SPLITTER teaches a binocular ferrite core transformer mounted on a modular substrate. A first winding is composed of three wires wound around a first leg of the binocular core and a second winding is composed of two wires wound around a third leg of the binocular core. The ferrite binocular core is glued to a low temperature cofired ceramic (LTCC) substrate, containing passive components as well as interconnect vias, and the substrate top surface has conductive pads that the wires are soldered to. The circuit formed by the two windings comprises a matching transformer and a divider. The graphs for this transformer circuit show performance extending to only about 1,000 MHz, and the substrate is a complex and expensive component to manufacture.

U.S. Pat. No. 7,012,485 entitled MINIATURE WIDEBAND RF CHOKE teaches a binocular ferrite core glued to an LTCC substrate and having a single wire wound in specific numbers of turns around each of the three core legs. The LTCC substrate contains passive components as well as interconnect vias, and the substrate top surface has conductive pads that the wires are soldered to. While the performance of this circuit extends out to at least 10,000 MHz, the circuit has only a single winding and only functions as a wideband choke.

A more capable transformer circuit would be a dual output autotransformer functioning as a transformer/balun with good impedance matching over a frequency range of 30 MHz to 3,000 MHz while having a highly miniaturized form factor, be fabricated out of readily available materials, and be surface mountable using standard robotic pick and place machinery.

The present invention has the same footprint as the Model TC2-1TG2+ and the Synergy TM-2-1; however both of these transformers operate over much lower frequency ranges.

SUMMARY OF THE INVENTION

In this invention, a transformer/balun is realized by employing a novel topology in which three transformers are wound on a single, high permeability, ferrite, binocular core. The binocular core is seen as having a first leg, a second leg in the middle, a third leg and a pair of apertures disposed intermediate the three legs. The three transformers are (1) an autotransformer; (2) a coupled winding to the autotransformer; and, (3) a transmission line transformer. An input is connected to one end of the autotransformer winding, the transmission line transformer is connected to the tap of the autotransformer winding, the transmission line transformer provides an in-phase output, and the coupled winding provides an out-of-phase output. Thus, within the topology employed, the outputs of the coupled line transformer and the transmission line transformer provide the balanced output (secondary) and the input to the autotransformer forms the unbalanced primary. Such an approach results in a wideband response of from 30 MHz to 3000 MHz or greater with the requisite amplitude and phase balance.

Within the transformer/balun of the present invention, the transmission line transformer uses a 34 gauge twisted pair wire and the autotransformer winding and coupled winding together use a 36 twisted triplet wire. The wires are twisted to approximately 7 twists per inch. The 34 gauge wire is wound approximately 3.5 turns around the first leg of the core and the 36 gauge wire is wound approximately 1.5 turns around the third leg of the core, one wire is separated out, and the remaining two wires are wound an additional two turns around the third leg. The wire separated out functions as the input.

Additionally the transformer/balun of the present invention, at high frequency, has a return loss of approximately 12 dB. Within the teaching hereof, further enhancement of the transformer/balun performance is realized through an external matching circuit that includes a series inductor L1 and a shunt capacitor C1. This improves the return loss to 15 dB or higher.

The transformer/balun hereof is secured with chipbonder adhesive to a six lead header which functions as a substrate. The six lead header has a conductive bonding pad for each lead and the transformer wires are welded to the pads. A substantially planar lid is secured on top of the core, thus providing a means for handling by standard pick and place machinery, and the entire assembly occupies a volume that is 0.15 inch×0.15 inch×0.15 inch.

OBJECTS AND FEATURES OF THE INVENTION

It is an object of the present invention to provide a wideband transformer having a 30-3000 MHz bandwidth with good impedance matching.

It is another object of the present invention to have a return loss of at least 12 dB.

It is still another object of the present invention to have a footprint of approximately 0.15 inch×0.15 inch×0.15 inch.

It is yet another object of the present invention to be surface mountable with standard automated pick and place equipment.

It is a feature of the present invention to utilize three transformers all wound on a single, high permeability, ferrite, binocular core.

It is another feature of the present invention that the three transformers are (1) an autotransformer; (2) a coupled winding to the autotransformer; and, (3) a transmission line transformer.

It is still another feature of the present invention that the outputs of the coupled winding to the autotransformer and the transmission line transformer provide the balanced output (secondary) and the input to the autotransformer forms the unbalanced primary.

BRIEF DESCRIPTION OF THE DRAWINGS

The present version of the invention will be more fully understood with reference to the following Detailed Description in conjunction with the drawings of which.

DESCRIPTION OF THE PREFERRED EMBODIMENT AND BEST MODE

Referring now to FIGS. 1 through 4, a dual output autotransformer is shown. The secondary winding of the transformer also comprises a portion of the primary winding. The autotransformer as shown in has a binocular core 12, preferably made from a high permeability ferrite material. The preferred core dimensions are approximately 0.096" high×0.080" wide. The wire used for the windings is two strand twisted 34 gauge and three strand twisted 36 gauge, both preferably 7 twists per inch. For purposes of clarity, specific colors have been assigned to the different wires, although wires of any other colors are still within the scope of the invention. Side A of the core is wound with 3.5 turns of red and green twisted 34 gauge dual wire, and Side B of the core is wound with 1.5 turns of red, green and gold twisted 36 gauge triple wire, then the gold wire is separated and brought out from the winding, then another 2 turns of the remaining red and green wire is wound. Red is abbreviated RD, green is abbreviated GR, and gold is abbreviated GD. Approximately 1 inch of wire is left to terminate each portion of the windings. The preferred starting length of each twisted wire is approximately 2.7 inches.

Figure 1:
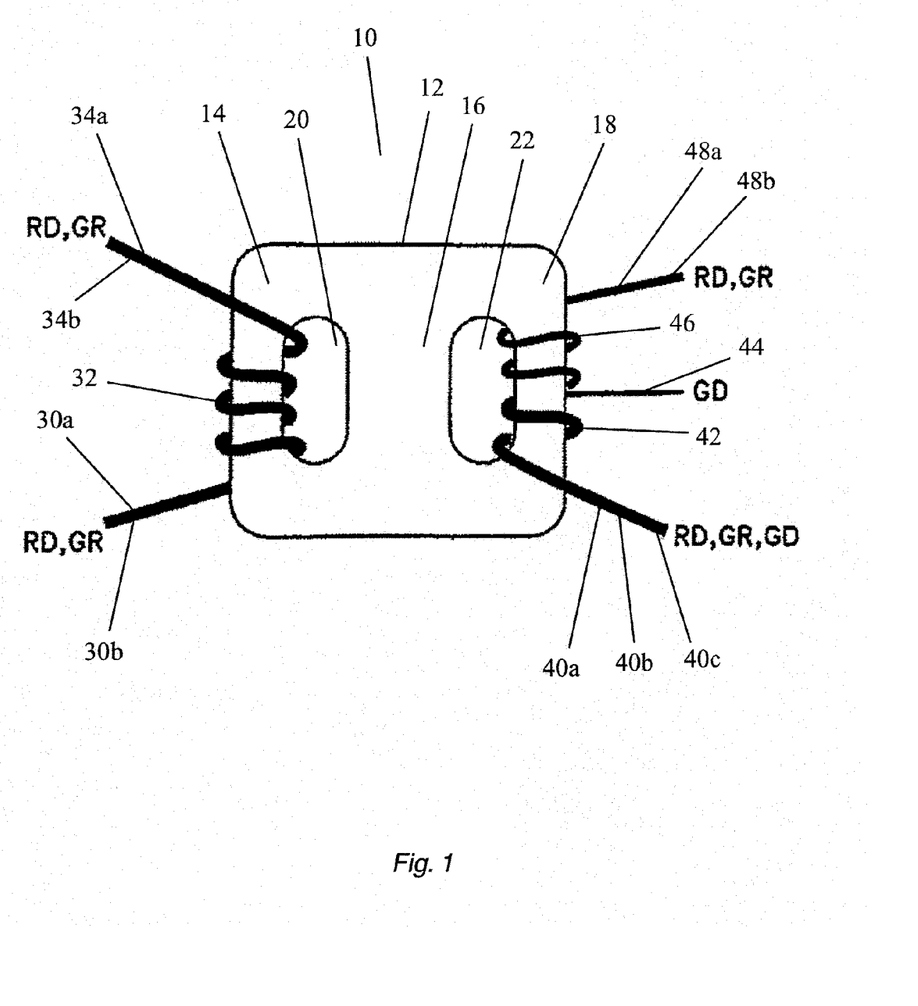
FIG. 1 shows a side elevation view of the autotransformer core and windings.

FIG. 1 shows the basic autotransformer 10. Side A of the binocular core 12 includes a first leg 14 and a first aperture 20. Side C of the binocular core 12 includes a third leg 18 and a second aperture 22. Between Side A and Side C is a second leg 16. Note that referenced to the autotransformer as shown in FIGS. 2a, 2b, 2c, 3a and 3b, the wire orientation in FIG. 1 is inverted. The dual winding on Side A or the first leg 14 has a first red end 30a, a first green end 30b, a dual winding coil 32, a second red end 34a, and a second green end 34b. The triple winding on Side C or the third leg 18 has a first red end 40a, a first green end 40b, a first gold end 40c, a triple winding coil 42, a second gold end 44, a dual wire coil 46, a second red end 48a, and a second green end 48b.

Figure 2A:
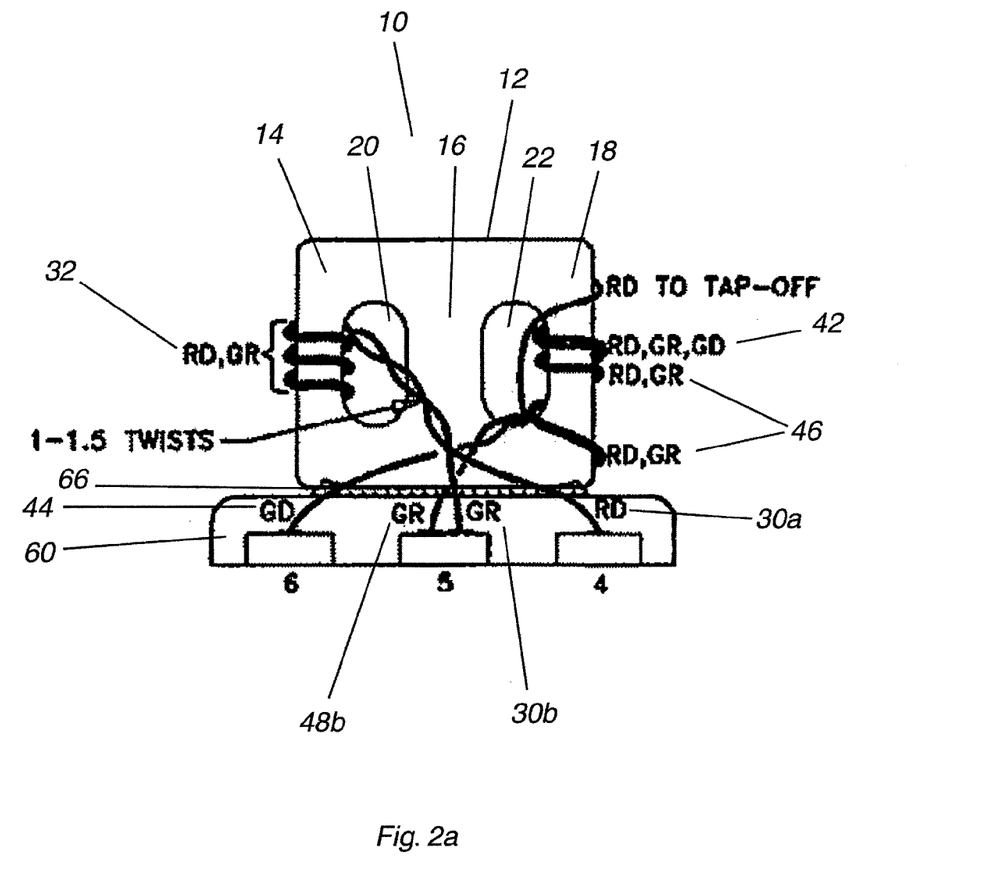
FIG. 2a shows a side elevation view of the autotransformer core and windings mounted on a header.
Figure 2B:
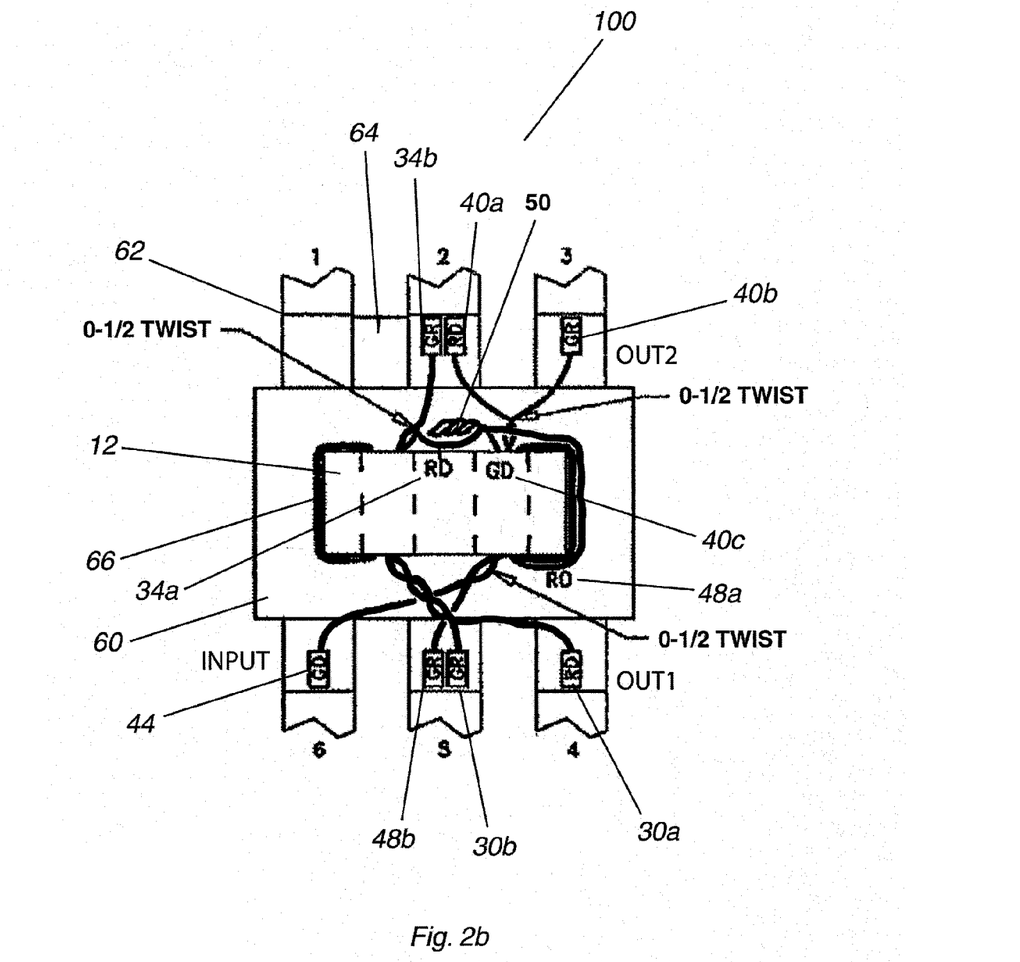
FIG. 2b shows a plan view of the autotransformer core and windings mounted on a header.
Figure 2C:
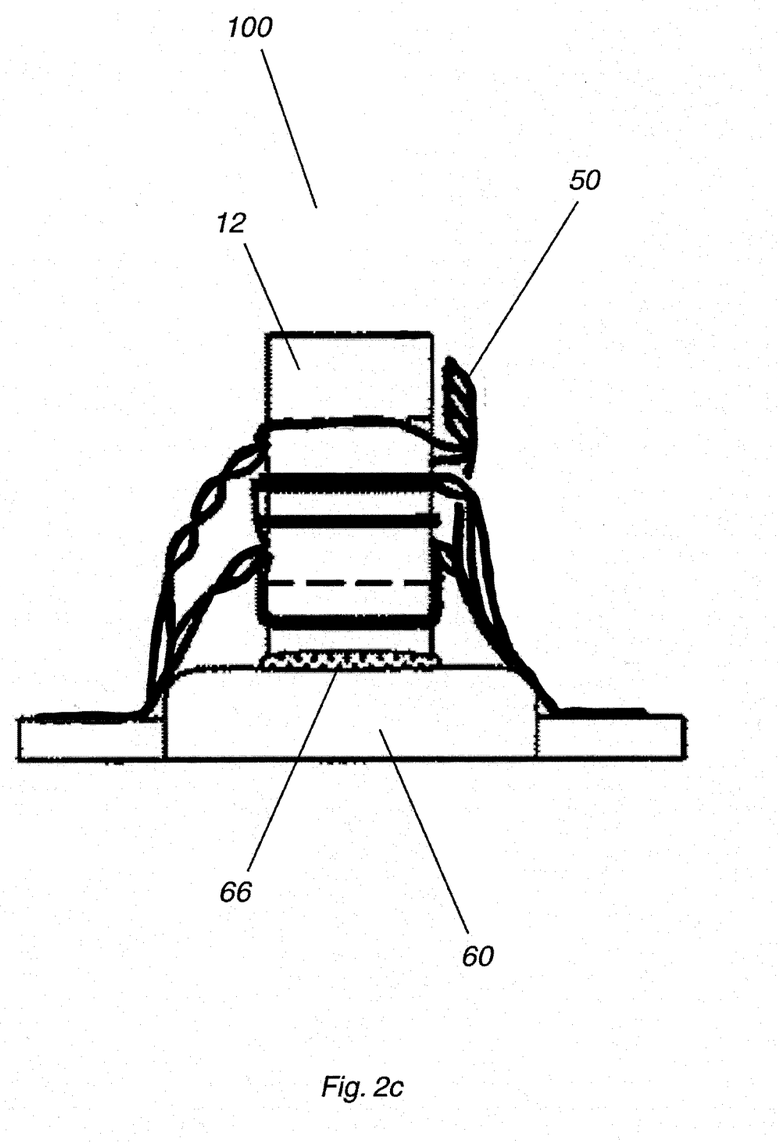
FIG. 2c shows an end elevation view of the autotransformer core and windings mounted on a header.

The autotransformer is packaged by bonding the core to a 6 lead header and conductively bonding the wires into the configuration shown in FIGS. 2a, 2b and 2c, wherein all three views the wound core shown in FIG. 1 have been inverted. A chipbonder adhesive 66 is used to attach the core to the header 60. The preferred conductive bonding method is welding rather than soldering. A tap-off 50 is created by twisting together and soldering the second A side red wire end 34a, the first C side red wire end 48a, and the first C side gold wire end 40c. The tap-off 50 is secured to the header 60 surface without being allowed to touch any of the leads. FIGS. 2a and 2b also show where given ranges of twist are required for groups of wires leaving the core windings. After all the wires are bonded and the chipbonder adhesive 66 is cured, the leads are trimmed. FIG. 2c shows a side view of the assembled autotransformer 100. The header 60 leads 1-6 have score lines 62 for accurate separation from production carriers and/or arrays of headers. Chart 1 below shows the wires and terminations for the assembled autotransformer 100 as detailed in FIGS. 2a, 2b and 2c. Lead 1 has no wiring connection.

CHART 1

| Wire Ends: | Reference: | Terminations: | Circuit Portion: |
|---|---|---|---|
| First A red | 30a | Lead 4 | Out1 |
| First A green | 30b | Lead 5 | Ground |
| Second A red | 34a | Tap-off | — |
| Second A green | 34b | Lead 2 | Ground |
| First C red | 40a | Lead 2 | Ground |
| First C green | 40b | Lead 3 | Out2 |
| First C gold | 40c | Tap-off | — |
| Second C red | 48a | Tap-off | — |
| Second C green | 48b | Lead 5 | Ground |
| Second C Gold | 44 | Lead 6 | Input |

Using the unique topology wherein the three above-described transformers are wound on a single, binocular core, a dual output transformer is provided with bandwidth of 30 MHz to 3000 MHz.

Figure 3A:
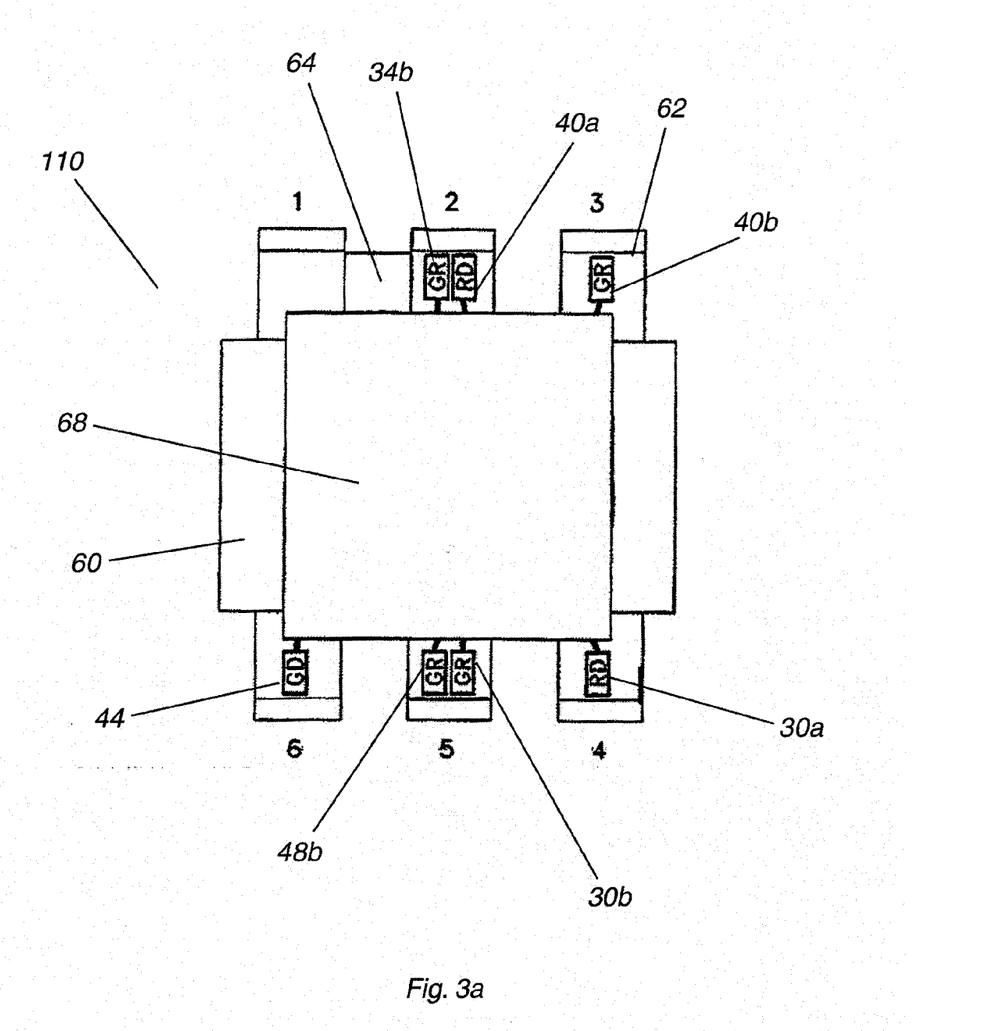
FIG. 3a shows a plan view of the assembled autotransformer with a lid.
Figure 3B:
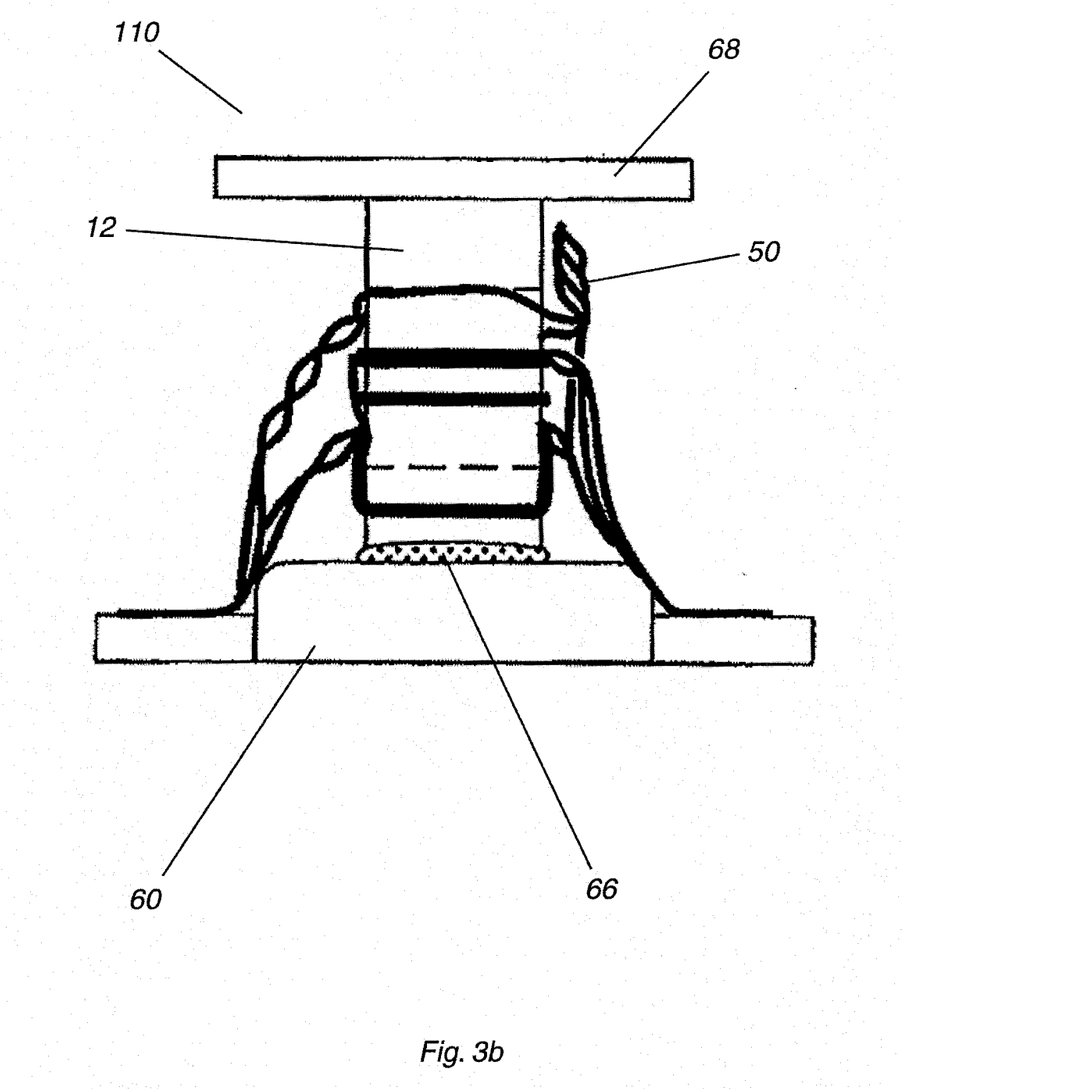
FIG. 3b shows an end elevation view of the assembled autotransformer with a lid.

FIGS. 3a and 3b show the fully assembled autotransformer 110 with a lid 68 attached. The lid 68 facilitates handling by present assembly equipment. Optionally, the lid 68 may be omitted. The overall package dimensions with the lid 68 attached are 0.15 inch×0.15 inch×0.15 inch.

Figure 4:
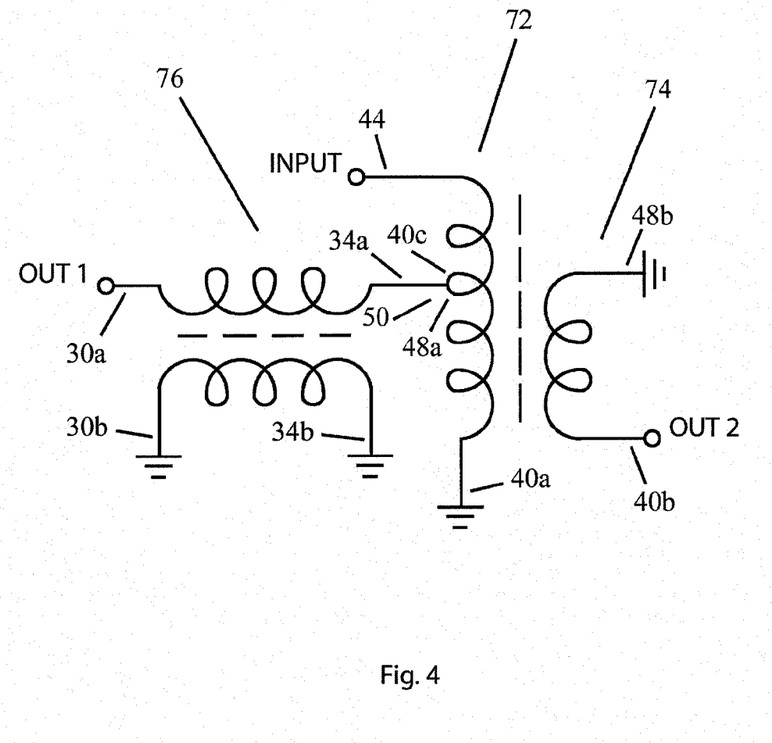
FIG. 4 shows a circuit schematic of the assembled autotransformer.

FIG. 4 shows a schematic of the circuit, including the autotransformer 72, coupled winding to the autotransformer 74, and transmission line transformer 76. The Input terminal is connected to one end of the autotransformer 72 winding, the Out 1 terminal provides an in-phase secondary output connected to one end of a winding of the transmission line transformer 74 where the other end of the transmission line transformer winding is connected to the tap-off from the autotransformer 72, and the Out 2 terminal provides an out-of-phase secondary output connected to one end of the coupled winding 76.

Relating FIGS. 2a, 2b, 2c, FIG. 4 and Chart 1, wire A Red is the portion of the transmission line transformer 76 from the tap-off 50 from the autotransformer 72 to the Out 1 terminal. Wire A Green is the portion of the transmission line transformer 76 connected to ground at both ends. Wire C Gold is the portion of the autotransformer 72 from the Input terminal to the tap-off 50. Wire C Red is the portion of the autotransformer 72 from the tap-off 50 to ground. Wire C Green is the coupled winding to the autotransformer 74 from the Out 2 terminal to ground.

Windings of the autotransformer 72 and the coupled winding to the autotransformer 74 are twisted together to minimize insertion loss. Likewise, windings of the transmission line transformer 76 are twisted together to minimize insertion loss.

Figure 5A:
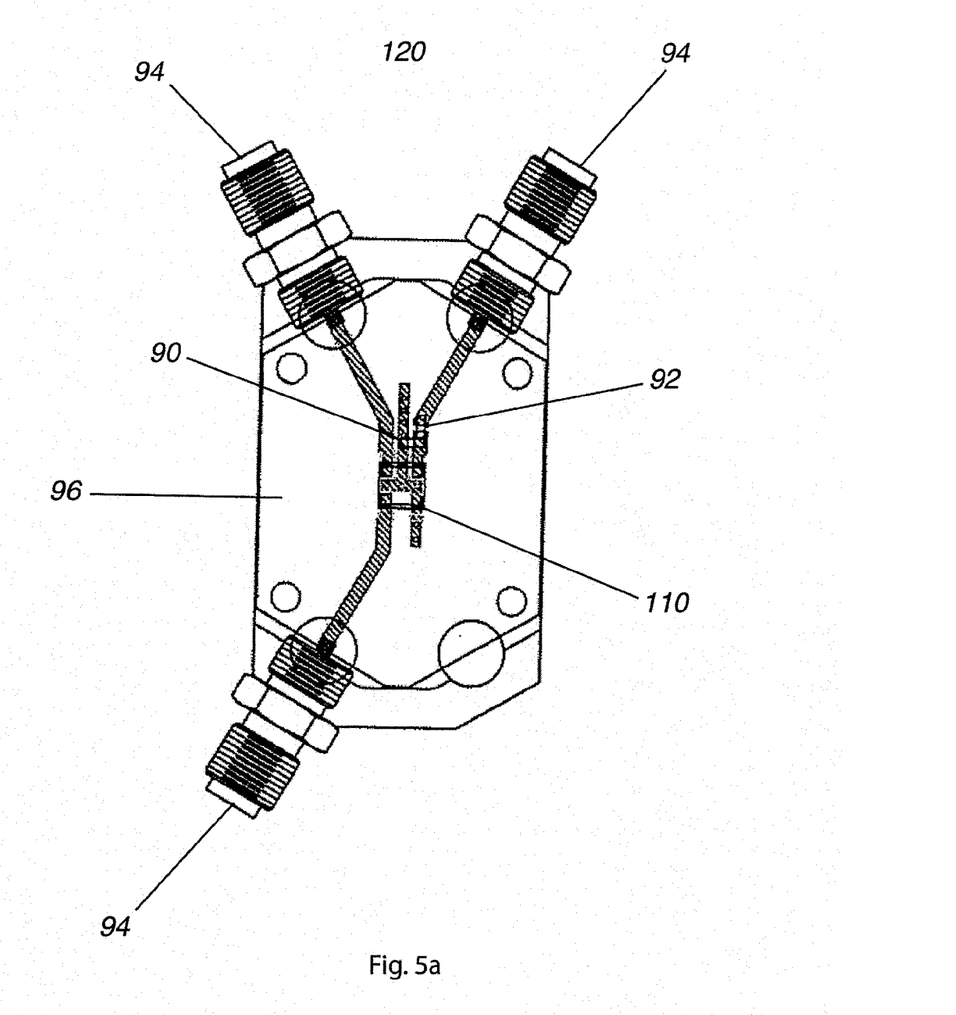
FIG. 5a shows a testing circuit for the assembled autotransformer.
Figure 5B:
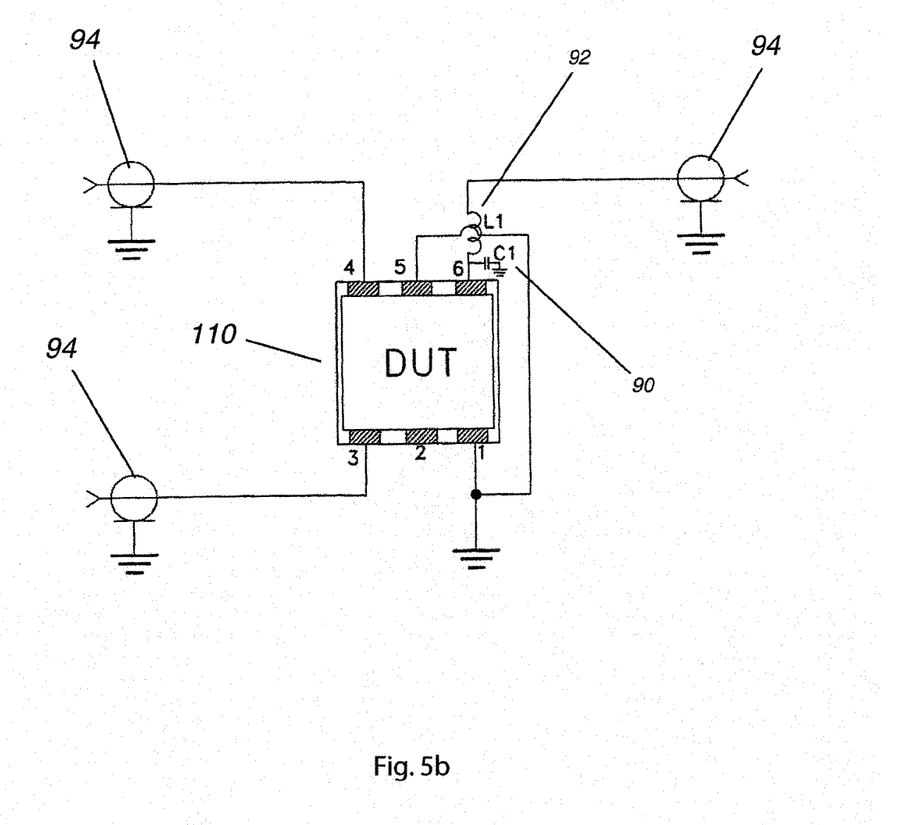
FIG. 5b shows a schematic diagram of the assembled autotransformer configured for testing.

FIGS. 5a and 5b show respectively the testing circuit 120 and testing schematic for the autotransformer 110, including an external inductor 92 of approximately 1.9 nH and an external capacitor 90 of approximately 0.5 pF. The connectors 94 are preferably 50 Ohm female SMA connectors, and the PCB material 96 is preferably 0.020 inch thick Rogers R04350B material with a dielectric constant of 3.5. Chart 2 shows test results for frequencies from 20 MHz to 3000 MHz and exhibits remarkable performance improvement over the prior art.

CHART 2

TEST CONDITIONS: Z:50 OHM SYSTEM. TEMPERATURE: ROOM

| FREQUENCY (MHz) | Pin (dBm) | I.LOSS S-1 (dB) | I.LOSS S-2 (dB) | Amp Unb (dB) | I.LOSS Average (dB) | I.PHASE S-1 (DEG) | I.PHASE S-2 (DEG) | Pha Unb (DEG) | R.LOSS Port-S (dB) | VSWR Port-S (:1) |
|---|---|---|---|---|---|---|---|---|---|---|
| 20.0000 | .00 | 3.78 | 3.78 | .00 | 3.78 | −.78 | 179.10 | 179.88 | 31.37 | 1.06 |
| 30.0000 | .00 | 3.79 | 3.79 | .00 | 3.79 | −1.64 | 178.14 | 179.79 | 31.60 | 1.05 |
| 40.0000 | .00 | 3.80 | 3.80 | .00 | 3.80 | −2.38 | 177.34 | 179.72 | 31.25 | 1.06 |
| 50.0000 | .00 | 3.80 | 3.81 | .01 | 3.80 | −3.04 | 176.60 | 179.64 | 30.86 | 1.06 |
| 70.0000 | .00 | 3.82 | 3.82 | .01 | 3.82 | −4.30 | 175.20 | 179.50 | 29.94 | 1.07 |
| 90.0000 | .00 | 3.83 | 3.82 | .00 | 3.83 | −5.53 | 173.84 | 179.36 | 28.69 | 1.07 |
| 100.0000 | .00 | 3.83 | 3.83 | .00 | 3.83 | −6.13 | 173.17 | 179.30 | 28.38 | 1.08 |
| 200.0000 | .00 | 3.88 | 3.89 | .00 | 3.89 | −12.02 | 166.64 | 178.67 | 24.34 | 1.13 |
| 300.0000 | .00 | 3.94 | 3.95 | .01 | 3.94 | −17.73 | 160.24 | 177.97 | 21.68 | 1.18 |
| 400.0000 | .00 | 4.00 | 4.03 | .02 | 4.01 | −23.41 | 153.95 | 177.37 | 19.76 | 1.23 |
| 500.0000 | .00 | 4.08 | 4.11 | .03 | 4.09 | −29.04 | 147.78 | 176.83 | 18.42 | 1.27 |
| 600.0000 | .00 | 4.16 | 4.20 | .05 | 4.18 | −34.67 | 141.81 | 176.48 | 17.45 | 1.31 |
| 700.0000 | .00 | 4.24 | 4.30 | .05 | 4.27 | −40.21 | 135.94 | 176.16 | 16.68 | 1.34 |
| 800.0000 | .00 | 4.32 | 4.39 | .07 | 4.36 | −45.78 | 130.18 | 175.96 | 16.08 | 1.37 |
| 900.0000 | .00 | 4.39 | 4.51 | .12 | 4.45 | −51.39 | 124.51 | 175.90 | 15.60 | 1.40 |
| 1000.0000 | .00 | 4.46 | 4.62 | .16 | 4.54 | −57.03 | 119.04 | 176.08 | 15.28 | 1.42 |
| 1200.0000 | .00 | 4.62 | 4.80 | .18 | 4.71 | −68.53 | 108.34 | 176.87 | 14.92 | 1.44 |
| 1400.0000 | .00 | 4.79 | 4.92 | .13 | 4.85 | −80.14 | 97.79 | 177.93 | 14.93 | 1.44 |
| 1600.0000 | .00 | 4.99 | 4.98 | .01 | 4.98 | −91.88 | 87.12 | 179.00 | 15.16 | 1.42 |
| 1800.0000 | .00 | 5.19 | 5.01 | .18 | 5.10 | −103.83 | 76.40 | 179.78 | 15.63 | 1.40 |
| 2000.0000 | .00 | 5.40 | 5.02 | .38 | 5.21 | −116.13 | 65.64 | 178.23 | 16.51 | 1.35 |
| 2200.0000 | .00 | 5.63 | 5.03 | .60 | 5.33 | −128.69 | 54.72 | 176.59 | 17.80 | 1.30 |
| 2300.0000 | .00 | 5.74 | 5.06 | .67 | 5.40 | −135.01 | 49.12 | 175.87 | 18.43 | 1.27 |
| 2400.0000 | .00 | 5.84 | 5.11 | .74 | 5.40 | −141.37 | 43.39 | 175.24 | 19.06 | 1.25 |
| 2500.0000 | .00 | 5.94 | 5.17 | .77 | 5.56 | −147.71 | 37.50 | 174.79 | 19.48 | 1.24 |
| 2600.0000 | .00 | 6.04 | 5.26 | .79 | 5.65 | −154.14 | 31.53 | 174.33 | 19.69 | 1.23 |
| 2700.0000 | .00 | 6.16 | 5.36 | .80 | 5.76 | −160.57 | 25.51 | 173.92 | 19.75 | 1.23 |
| 2800.0000 | .00 | 6.28 | 5.46 | .82 | 5.87 | −166.94 | 19.34 | 173.72 | 19.65 | 1.23 |
| 2900.0000 | .00 | 6.41 | 5.58 | .83 | 6.00 | −173.24 | 13.04 | 173.72 | 19.45 | 1.24 |
| 3000.0000 | .00 | 6.55 | 5.72 | .83 | 6.14 | −179.40 | 6.64 | 173.96 | 19.27 | 1.24 |

Chart 3 shows the results of a power handling test with consistently maintained power and insertion loss values over time.

CHART 3

Power Handling Test
Model Name: TC2-33-2+_ED14492 Tested by: SZ
condition: Terminated output port 1 and test output port 2.
Temp: ROOM

| | Initial Reading | | | After 30 minutes | | |
|---|---|---|---|---|---|---|
| Freq MHz | Input power dBm | Output power dBm | Insertion loss dB | Output power dBm | Insertion Loss dB | Temp °C. |
| 10 | 24 | 20.17 | 3.83 | 20.13 | 3.87 | <50 |
| 10 | 27 | 23.23 | 3.77 | 23.2 | 3.8 | <50 |
| 10 | 30 | 26.1 | 3.9 | 26.09 | 3.91 | <50 |
| 3000 | 24 | 17.93 | 6.07 | 17.97 | 6.03 | <50 |
| 3000 | 27 | 21.26 | 5.74 | 21.23 | 5.77 | <50 |
| 3000 | 30 | 24.13 | 5.87 | 23.95 | 6.05 | 60° C. |

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A dual output autotransformer comprising:
an autotransformer winding having an input, a ground and a tap-off;
a transmission line transformer having an in-phase secondary output, an electrical connection to said tap-off, and two grounds;
said autotransformer winding having a coupled winding thereto providing an out-of-phase secondary output;
said coupled winding further having a ground;
a binocular core having a first leg, a second leg, a third leg, a first aperture and a second aperture;
said transmission line transformer being wound around said first leg and through said first aperture, said transmission line transformer further comprises a twisted pair having a first wire and a second wire; and,
said autotransformer winding and said coupled winding being wound around said third leg and through said second aperture, said autotransformer and said coupled winding further comprise a twisted triplet wire having a third wire, a fourth wire, and a fifth wire.

2. A dual output autotransformer as described in claim 1, wherein:
said first wire has a first upper end and a first lower end;
said second wire has a second upper end and second lower end;
said third wire has a third upper end and a third lower end;
said fourth wire has a fourth upper end and fourth lower end;
said fifth wire has a fifth upper end and a fifth lower end;
said upper second end is electrically connected to said lower fourth end;
said lower second end is electrically connected to said upper third end; and,
said lower first end is electrically connected to said lower third end and to said upper fifth end.

3. A dual output autotransformer as described in claim 2, wherein the electrical connection of said lower first end, said lower third end and said upper fifth end is said tap-off and electrically isolated from any other electrical contact.

4. A dual output autotransformer as described in claim 2, wherein:
said twisted pair wire is wound approximately 3.5 turns around said first leg;
said twisted triplet wire is wound approximately 1.5 turns around said third leg, said fifth wire is separated out from said triplet wire, and said third and fourth wires are wound approximately a further two turns around said third leg; and,
said separated out portion of said fifth wire is an input.

5. A dual output autotransformer as described in claim 2, wherein said twisted pair wire comprises 34 gauge conductors and said twisted triplet wire comprises 36 gauge conductors.

6. A dual output autotransformer as described in claim 4, wherein said binocular core is secured to a substrate comprising a 6 lead header.

7. A dual output autotransformer as described in claim 6, wherein said binocular core is secured to said substrate by means of a chipbonder adhesive.

8. A dual output autotransformer comprising
an autotransformer winding having an input, a ground and a tap-off;
a transmission line transformer having an-in-phase secondary output, an electrical connection to said tap-off, and two grounds;
said autotransformer winding having a coupled winding thereto providing an out-of-phase secondary output;
said coupled winding further having a ground;
a binocular core having a first leg, a second leg, a third leg, a first aperture and a second aperture, said binocular core secured to a substrate comprising:
a 6 lead header is secured substrate by means of a chipbonder adhesive;
said transmission line transformer being wound around said first leg and through said first aperture; and,
said autotransformer winding and said coupled winding being wound around said third leg and through said second aperture;
a substantially planar lid secured on top of said binocular core for handling by standard robotic pick and place machinery.

9. A dual output autotransformer as described in claim 8, wherein said binocular core is secured to a substrate comprising said 6 lead header and having a conductive bonding pad for each lead and said wires are welded to said conductive bonding pads.

10. A dual output autotransformer as described in claim 8, wherein the bandwidth of said autotransformer is at least 30-3000 MHz.

11. A dual output autotransformer as described in claim 10 wherein the transformer has a return loss of at least 12 dB.

12. A dual output autotransformer as described in claim 11, further comprising an external matching circuit, whereby the return loss is improved to at least 15 dB.

13. A dual output autotransformer as described in claim 8, wherein said twisted pair wire and said twisted triplet wire is twisted with approximately 7 twists per inch.

14. A dual output autotransformer as described in claim 8, wherein the overall assembled dimensions are no greater than approximately 0.15 inch×0.15 inch×0.15 inch.

15. A dual output autotransformer as described in claim 8, wherein said core is made form high permeability ferrite material.

16. A dual output autotransformer comprising:
an autotransformer winding having an input, a ground and a tap;
a transmission line transformer having an in-phase secondary output, an electrical connection to said tap, and two grounds;
said autotransformer winding having a coupled winding thereto providing an out-of-phase secondary output;
said coupled winding further having a ground;
a binocular core having a first leg, a second leg, a third leg, a first aperture and a second aperture;
wherein said core is made from high permeability ferrite material;
said transmission line transformer being wound around said first leg and through said first aperture;
said autotransformer winding and said coupled winding being wound around said third leg and through said second aperture;
said transmission line transformer further comprises a twisted pair wire having a first wire and a second wire;

said autotransformer winding and said coupled winding further comprises a twisted triplet wire having a third wire, a fourth wire and a fifth wire;

said twisted pair wire and said twisted triplet wire is twisted with approximately 7 twists per inch;

said twisted pair wire is wound approximately 3.5 turns around said first leg;

said twisted triplet wire is wound approximately 1.5 turns around said third leg, said fifth wire is separated out from said triplet wire, and said third and fourth wires are wound approximately a further two turns around said third leg;

said fifth wire is said input;

said twisted pair wire comprises 34 gauge conductors and said twisted triplet wire comprises 36 gauge conductors;

said binocular core is secured by means of a chipbonder adhesive to a substrate comprising a 6 lead header;

said 6 lead header has a conductive bonding pad for each lead and said wires are welded to said conductive bonding pads;

a substantially planar lid is secured on top of said binocular core, thereby providing means for handling by standard robotic pick and place machinery; and, wherein the overall assembled dimensions are no greater than approximately 0.15 inch×0.15 inch×0.15 inch.

17. A dual output autotransformer as described in claim 16, wherein the bandwidth of said autotransformer is at least 30-3000 MHz.

18. A dual output autotransformer as described in claim 16 wherein the transformer has a return loss of at least 12 dB.

19. A dual output autotransformer as described in claim 16, further comprising an external matching circuit, whereby the return loss is improved to at least 15 dB.

20. A dual output autotransformer as described in claim 7, wherein a substantially planar lid is secured on top of said binocular core thereby providing for handling by standard pick and place machinery.

* * * * *